(12) United States Patent
Shim et al.

(10) Patent No.: US 8,159,130 B2
(45) Date of Patent: Apr. 17, 2012

(54) FOLDABLE DISPLAY DEVICE

(75) Inventors: Hong-shik Shim, Seoul (KR); In-seo Kee, Seongnam-si (KR); Young-tea Chun, Suwon-si (KR)

(73) Assignees: Samsung Electronics Co., Ltd. (KR); Samsung Mobile Display Co., Ltd. (KR)

( * ) Notice: Subject to any disclaimer, the term of this patent is extended or adjusted under 35 U.S.C. 154(b) by 201 days.

(21) Appl. No.: 12/572,320

(22) Filed: Oct. 2, 2009

(65) Prior Publication Data

US 2010/0187979 A1 Jul. 29, 2010

(30) Foreign Application Priority Data

Jan. 23, 2009 (KR) .................. 10-2009-0006273

(51) Int. Cl.
*H01L 51/52* (2006.01)

(52) U.S. Cl. .................. 313/511; 313/507; 345/1.1

(58) Field of Classification Search .................. 257/40, 257/72, 98–100, 642–643, 759; 313/498–512; 315/169.1, 169.3; 427/58, 64, 66, 532–535, 427/539; 428/690–691, 917; 438/26–29, 438/34, 82, 45; 445/24–25
See application file for complete search history.

(56) References Cited

U.S. PATENT DOCUMENTS

| | | | |
|---|---|---|---|
| 2003/0160564 A1* | 8/2003 | Park et al. | 313/512 |
| 2004/0207569 A1* | 10/2004 | Ho et al. | 345/1.1 |
| 2006/0132461 A1* | 6/2006 | Furukawa et al. | 345/173 |
| 2006/0146488 A1 | 7/2006 | Kimmel | |
| 2007/0146307 A1 | 6/2007 | Kuo et al. | |
| 2008/0158651 A1* | 7/2008 | Kawase et al. | 359/296 |

FOREIGN PATENT DOCUMENTS

| KR | 1020050085412 A | 8/2005 |
|---|---|---|
| KR | 100781708 B1 | 11/2007 |

* cited by examiner

*Primary Examiner* — Nimeshkumar Patel
*Assistant Examiner* — Donald Raleigh
(74) *Attorney, Agent, or Firm* — Cantor Colburn LLP

(57) ABSTRACT

A foldable display device includes; a plurality of substrates separated from one another by predetermined intervals, a plurality of driving units including at least one driving unit disposed on each of the plurality of substrates, a flexible display unit disposed above the plurality of substrates and including a plurality of pixel electrodes respectively corresponding to the plurality of driving units, and a flexible connection unit disposed between the plurality of substrates and the flexible display unit and which electrically connects the plurality of driving units and the plurality of pixel electrodes.

20 Claims, 3 Drawing Sheets

FOLDABLE DISPLAY DEVICE

CROSS-REFERENCE TO RELATED APPLICATION

This application claims the benefit of Korean Patent Application No. 10-2009-0006273, filed on Jan. 23, 2009, the contents of which in its entirety are herein incorporated by reference.

BACKGROUND

1. Field

One or more exemplary embodiments relate to a foldable display device.

2. Description of the Related Art

Typical foldable display devices are portable and have a relatively large-sized screen for the display device size. Foldable display devices are applied not only to mobile devices such as mobile phones, portable multimedia players ("PMPs"), navigation systems, ultra mobile personal computers ("UMPCs"), electronic books, electronic newspapers, etc. but also to televisions and monitors.

However, one of the problems of foldable display devices is the reliability of folding portions thereof, e.g., the sections of the display device which are subjected to folding stresses. To address this problem, a flexible substrate formed of plastic or metal foil is typically used as a substrate of the foldable display devices. However, due to the physical limits of flexible substrates and the need to protect thin film transistors ("TFT"), it is difficult to reduce the radius of curvature in the folding portions of the foldable display devices. Accordingly, since a large radius of curvature is to be provided in the folding portions of foldable display devices of the related art, the typical foldable display devices may only have correspondingly large thicknesses.

In addition, in order to realize a driving unit including a TFT on a substrate formed of a plastic material or a metal foil, an organic TFT or a low temperature process Si TFT is typically used due to the process of manufacturing foldable display devices. However, organic TFTs and low temperature process Si TFTs have low yields compared to amorphous Si TFTs.

SUMMARY

One or more exemplary embodiments include a foldable display device.

Additional aspects will be set forth in part in the description which follows and, in part, will be apparent from the description, or may be learned by practice of the present exemplary embodiments.

One or more exemplary embodiments may include a foldable display device including; a plurality of substrates separated from one another by predetermined intervals, a plurality of driving units including at least one driving unit disposed on each of the plurality of substrates, a flexible display unit disposed above the plurality of substrates and including a plurality of pixel electrodes respectively corresponding to the plurality of driving units, and a flexible connection unit disposed between the plurality of substrates and the flexible display unit and which electrically connects the plurality of driving units and the plurality of pixel electrodes.

In one exemplary embodiment, the flexible connection unit may include a flexible layer, and a plurality of conductors disposed in the flexible layer and which electrically connects the plurality of driving units and the plurality of pixel electrodes. In one exemplary embodiment, the flexible layer may include at least one of plastic and rubber.

In one exemplary embodiment, the flexible layer may include a plurality of via holes in which the plurality of conductors is disposed. In one exemplary embodiment, the via holes may extend substantially obliquely with respect to a center line of folding portions located between the plurality of substrates.

In one exemplary embodiment, the flexible connection unit may include a double-layered flexible printed circuit board ("FPCB").

In one exemplary embodiment, the FPCB may include a plurality of flexible films stacked between the plurality of substrates and the flexible display unit and, a plurality of conductors disposed in each of the flexible films and which electrically connects the plurality of driving units and the plurality of pixel electrodes. In one exemplary embodiment, each of the plurality of flexible films may include a plurality of via holes in which the plurality of conductors is disposed. In one exemplary embodiment, the plurality of via holes may be disposed substantially parallel to a center line of folding portions located between the plurality of substrates.

In one exemplary embodiment, the foldable display device may further include a plurality of first pads electrically connecting the plurality of pixel electrodes and the plurality of conductors, wherein the plurality of first pads are disposed on an upper surface of a flexible film disposed under and adjacent to the flexible display unit of the plurality of flexible films. In one exemplary embodiment, the foldable display device may further include; a plurality of second pads electrically connecting the plurality of pixel electrodes and the plurality of conductors, wherein the plurality of second pads are disposed on a bottom surface of a flexible film disposed above and adjacent to the plurality of substrates of the plurality of flexible films.

In one exemplary embodiment, the plurality of substrates may include a rigid material, exemplary embodiments of which include glass.

In one exemplary embodiment, the plurality of driving units may include thin film transistors ("TFTs"). In one exemplary embodiment, the TFTs may include amorphous silicon as a channel material.

In one exemplary embodiment, the flexible display unit may be an electrophoretic display. In one exemplary embodiment, the flexible display unit may include; an upper flexible substrate, a lower flexible substrate separated from the upper flexible substrate, a common electrode disposed on the upper flexible substrate, the plurality of pixel electrodes disposed on the lower flexible substrate, and a capsule layer disposed between the upper flexible substrate and the lower flexible substrate. In one exemplary embodiment, the capsule layer may include a plurality of microcapsules having a plurality of charged particles contained therein.

Also, in one exemplary embodiment, the flexible display unit may include; an upper flexible substrate, a lower flexible substrate separated apart from the upper flexible substrate, a common electrode disposed on the upper flexible substrate, the plurality of pixel electrodes disposed on the lower flexible substrate, and an organic light emitting layer disposed between the upper flexible substrate and the lower flexible substrate.

According to the exemplary embodiments, the flexible display unit and the flexible connection unit are formed on the substrates separated from one another by predetermined intervals, and thus a radius of curvature of folding portions where the flexible display unit and the flexible connection unit are folded may be minimized, and accordingly, a thin foldable display device having a relatively small thickness when folded may be realized. Also, glass substrates and amorphous silicon TFTs may be used, and thus manufacturing costs may be reduced and the reliability of the foldable display device may be improved.

BRIEF DESCRIPTION OF THE DRAWINGS

These and/or other aspects, advantages, and features of the invention will become more apparent and more readily appreciated from the following description of the exemplary embodiments, taken in conjunction with the accompanying drawings of which.

DETAILED DESCRIPTION

Figure 1:
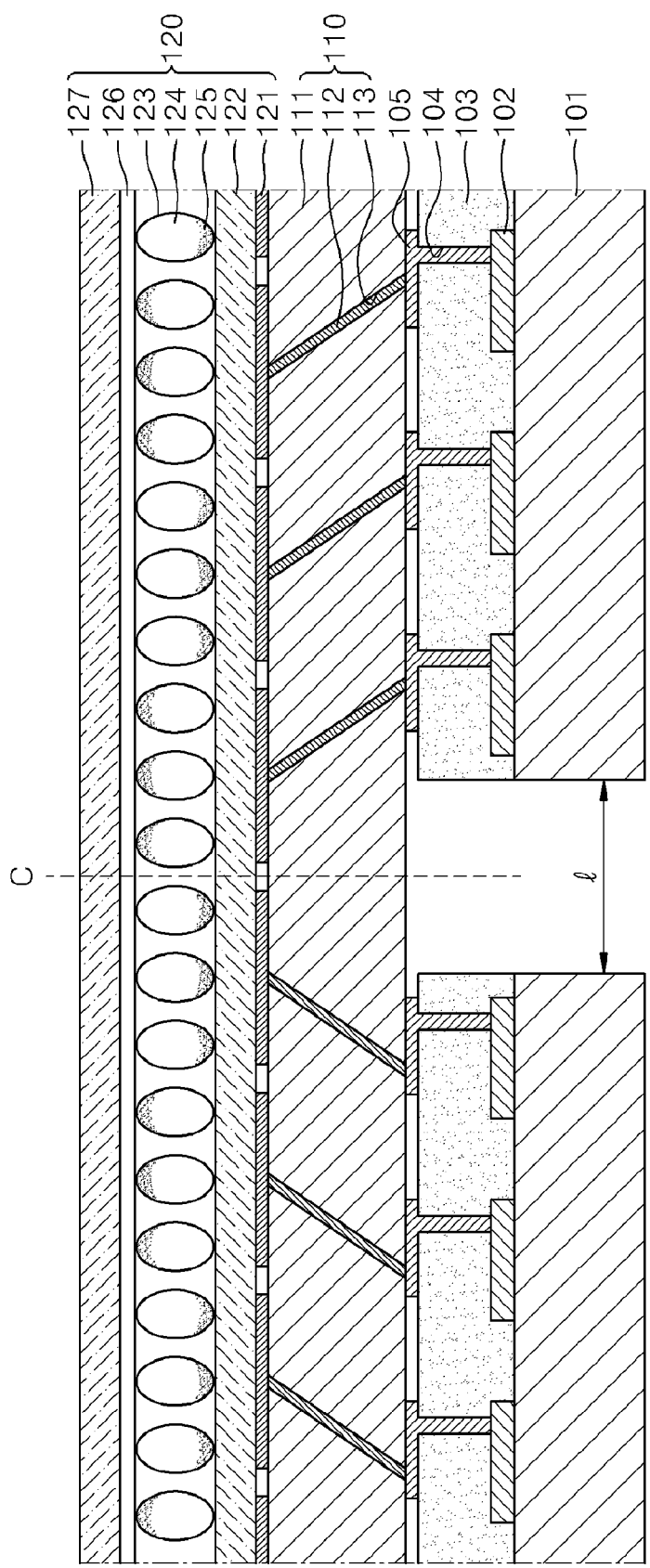
FIG. 1 is a cross-sectional view illustrating a portion of an exemplary embodiment of a foldable display device.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

FIG. 1 is a cross-sectional view illustrating a portion of an exemplary embodiment of a foldable display device.

Referring to FIG. 1, the present exemplary embodiment of a foldable display device includes a plurality of substrates 101, a flexible display unit 120 disposed above the substrates 101, and a flexible connection unit 110 disposed between the substrates 101 and the flexible display unit 120. Two individual substrates 101 of the plurality of substrates 101 are separated from one another by a predetermined interval l. In one exemplary embodiment, the substrates 101 may be formed of a rigid material. For example, in one exemplary embodiment, the substrates 101 may be formed of glass, but are not limited thereto.

A plurality of driving units 102 are disposed on each of a plurality of upper surfaces of the substrates 101 to drive pixels of the flexible display unit 120. In one exemplary embodiment, the driving units 102 may include thin film transistors ("TFTs"). In one exemplary embodiment, the TFTs may be amorphous Si TFTs which include amorphous silicon as a channel material, but are not limited thereto, and may also be organic TFTs or poly Si TFTs, or other TFTs having similar characteristics. A protection layer 103 is formed on the substrates 101 to cover the driving units 102, and a plurality of driving unit electrodes 105 electrically connected to the driving units 102 are formed on the protection layer 103. A plurality of via holes, also called through holes, 104 are formed in the protection layer 103 to connect the driving units 102 and the driving unit electrodes 105.

The flexible display unit 120, which includes a plurality of pixel electrodes 121 each corresponding to the driving units 102 disposed on the substrate 101, is located above the substrate 101. The flexible display unit 120 may include, for example, units that display an image using electrophoresis. In such an exemplary embodiment, the flexible display unit 120 includes upper and lower flexible substrates 127 and 122 that are separated from each other, a common electrode 126 disposed on a bottom surface of the upper flexible substrate 127, the pixel electrodes 121 disposed on a bottom surface of the lower flexible substrate 122, and a capsule layer disposed between the upper flexible substrate 127 and the lower flexible substrate 122.

In one exemplary embodiment, the upper and lower flexible substrates 127 and 122 may be formed of plastics, rubber or other materials having similar characteristics, but the upper and lower flexible substrates are not limited thereto. The capsule layer includes a plurality of microcapsules 123 which are filled with a liquid 124 in which predetermined colored charged particles 125 are dispersed. In the flexible display unit 120 having the above-described configuration, when a voltage is applied between the common electrode 126 and one of the pixel electrodes 121, the predetermined colored charged particles 125 move in the microcapsules 123 which are disposed above the pixel electrode 121 to which the voltage is applied, thereby forming an image. While the present exemplary embodiment has been described with respect to an electrophoretic display, alternative exemplary embodiments include configurations wherein alternative flexible display units may be used.

The flexible connection unit 110 is disposed between the substrates 101 and the flexible display unit 120 to electrically connect the driving units 102 and the pixel electrodes 121. The flexible connection unit 110 includes a flexible layer 111 having a predetermined thickness and a plurality of conductors 112 formed in the flexible layer 111 and electrically connecting the driving units 102 and the pixel electrodes 121. In one exemplary embodiment, the flexible layer 111 may be formed of plastic, rubber, or other materials having similar characteristics, but is not limited thereto. The conductors 112 are disposed in a plurality of via holes, also called through holes, 113 formed in the flexible layer 111. In the current exemplary embodiment, the via holes 113 may extend obliquely with respect to center lines C of folding portions between the substrates 101 where the flexible display unit 120 and the flexible connection unit 110 are folded.

Accordingly, a thin foldable display device may be realized by arranging the plurality of substrates 101 to be separated from one another by predetermined intervals l and disposing the flexible connection unit 110 and the flexible display unit 120 on the substrates 101 in the foldable display device having the above-described configuration. For example, in an exemplary embodiment wherein the combined thickness of the flexible display unit 120 and the flexible connection unit 110 is about several μm to several tens of μm, the radius of curvature of the folding portions where the flexible display unit 120 and the flexible connection unit 110 are folded may be about 1 mm or less.

Meanwhile, according to the current exemplary embodiment, the flexible display unit 120 displays an image using electrophoresis, but is not limited thereto, and various devices may also be used as the flexible display unit 120. For example, exemplary embodiments include configurations wherein the flexible display unit 120 may include an organic light emitting device ("OLED"). In such an exemplary embodiment, the flexible display unit 120 may include an organic light emitting layer (not shown) formed between the common electrode 126 formed on a bottom surface of the upper flexible substrate 127 and the plurality of the pixel electrodes 121 formed on a bottom surface of the lower flexible substrate 122.

Figure 2:
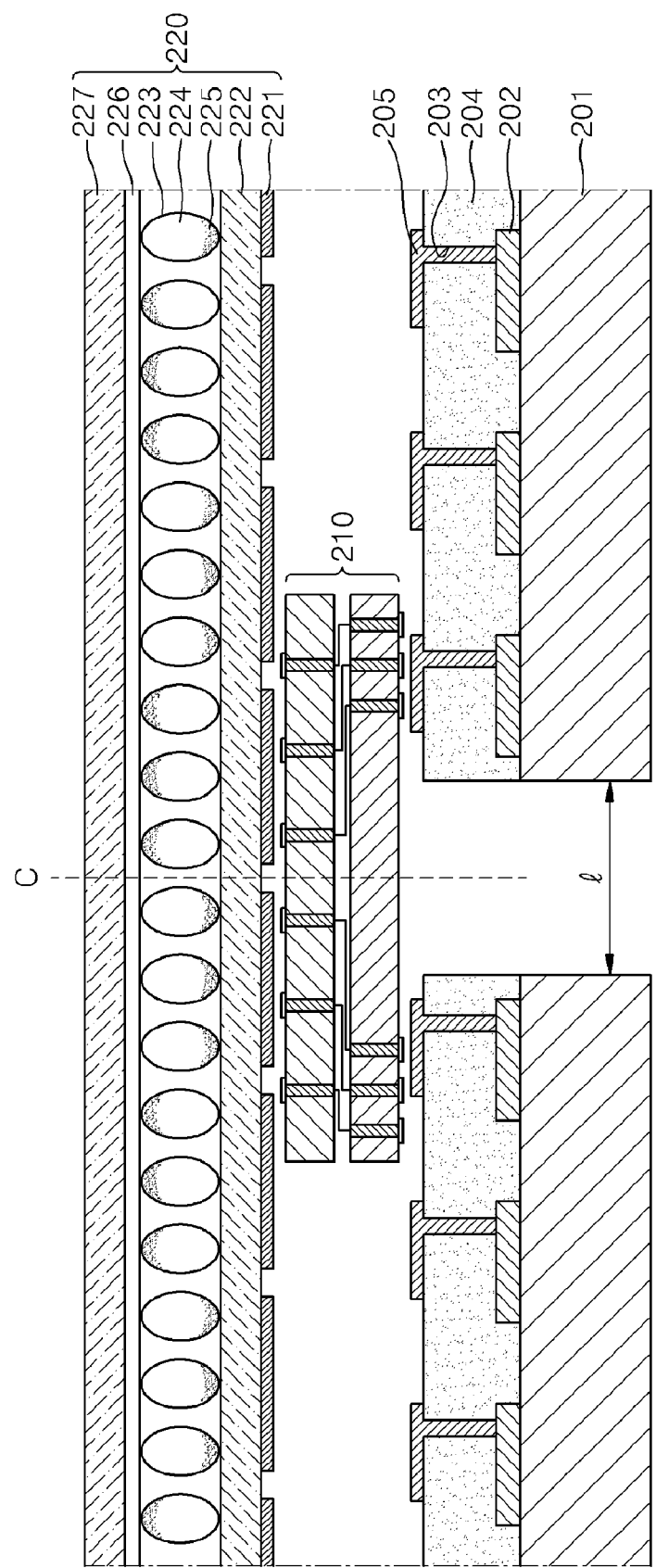
FIG. 2 is a cross-sectional view illustrating a portion of another exemplary embodiment of a foldable display device.
Figure 3:
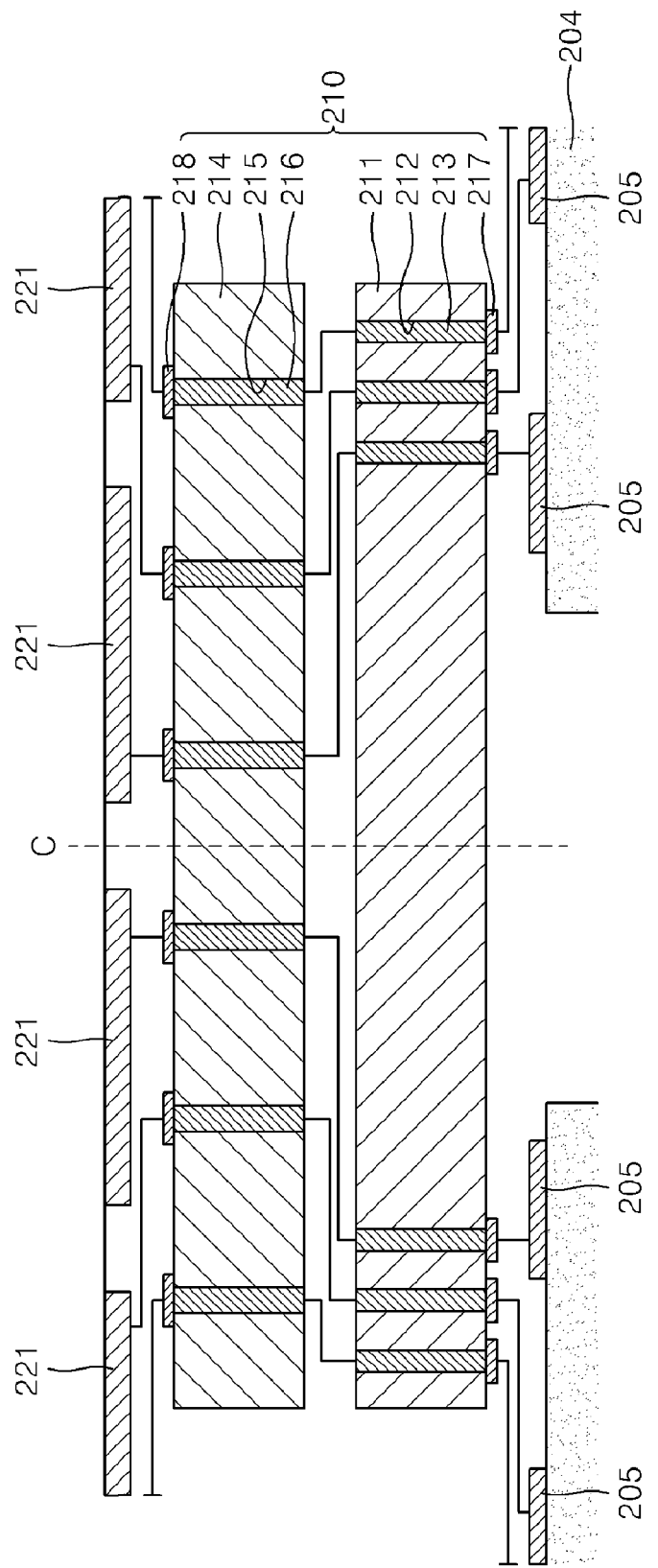
FIG. 3 is a detailed cross-sectional view of an exemplary embodiment of a double layered flexible printed circuit board of the exemplary embodiment of a foldable display device illustrated in FIG. 2.

FIG. 2 is a cross-sectional view illustrating a portion of another exemplary embodiment of a foldable display device, and FIG. 3 is a detailed cross-sectional view of an exemplary embodiment of a double layered flexible printed circuit board ("FPCB") 210 of the exemplary embodiment of a foldable display device illustrated in FIG. 2.

Referring to FIG. 2, the current exemplary embodiment of a foldable display device includes a plurality of substrates 201, a flexible display unit 220 disposed above the substrates 201 and a flexible connection unit is disposed between the substrates 201 and the flexible display unit 220. The substrates 201 are separated from one another by predetermined intervals l. In one exemplary embodiment, the substrates 201 may be formed of a rigid material. For example, in one exemplary embodiment, the substrates 201 may be formed of glass or other materials having similar characteristics, but are not limited thereto.

A plurality of driving units 202 is formed on each of a plurality of upper surfaces of the substrates 201 to drive pixels of the flexible display unit 220. In one exemplary embodiment, the driving units 202 may include TFTs. Exemplary embodiments include configurations wherein the TFTs may be amorphous Si TFTs which include amorphous silicon as a channel material, but the exemplary embodiments are not limited thereto, and may also be organic TFTs, poly Si TFTs or TFTs made from other materials having similar characteristics. A protection layer 204 is disposed over the substrates 201 to cover the driving units 202, and a plurality of driving unit electrodes 205 electrically connected to the driving units 202 are disposed on the protection layer 204. A plurality of via holes 203 is formed in the protection layer 204 to connect the driving units 202 and the driving unit electrodes 205. The above described structures of the current exemplary embodiment may be substantially similar to the previously described exemplary embodiment.

The flexible display unit 220, which includes a plurality of pixel electrodes 221 corresponding to the plurality of driving units 202, is disposed above the substrates 201. In one exemplary embodiment, the flexible display unit 220 may include a device displaying an image using electrophoresis. In such an exemplary embodiment, the flexible display unit 220 includes upper and lower flexible substrates 227 and 222, a common electrode 226, a plurality of pixel electrodes 221, and a capsule layer. Exemplary embodiments include configurations wherein the upper and lower flexible substrates 227 and 222 may be formed of plastic, rubber, or other materials having similar characteristics, but the exemplary embodiments are not limited thereto. The common electrode 226 may be disposed on a bottom surface of the upper flexible substrate 227, and the pixel electrodes 221 may be disposed on a bottom surface of the lower flexible substrate 222. The capsule layer may be disposed between the upper flexible substrate 227 and the lower flexible substrate 222. The capsule layer includes a plurality of microcapsules 223 which may be filled with a liquid 224 in which predetermined colored charged particles 225 are dispersed.

The double layered FPCB 210, which electrically connects the driving units 202 and the pixel electrodes 221, is disposed between the substrates 201 and the flexible display unit 220. In the current exemplary embodiment, the double-layered FPCB 210 may function as a flexible connection unit. Referring to FIG. 3, the double-layered FPCB 210 includes a first flexible film 214 disposed under the flexible display unit 220 and a second flexible film 211 disposed under the first flexible film 214.

A plurality of first conductors 216, which are electrically connected to the pixel electrodes 221, are disposed in the first flexible film 214. A plurality of first via holes, also called through holes, 215 are formed to penetrate the first flexible film 214. Also, a plurality of first pads 218 is disposed on the first flexible film 214 so that the first flexible film 214 is electrically connected to the pixel electrodes 221.

A plurality of second conductors 213, which are electrically connected to the driving unit electrodes 205, are disposed in the second flexible film 211 disposed under the first flexible film 214. A plurality of second via holes, also called through holes, 212 are formed to penetrate the second flexible film 211. Also, a plurality of second pads 217 may be disposed under the second flexible film 211 so that the second flexible film 211 is electrically connected to the driving unit electrodes 205.

Meanwhile, the first conductors 216 formed in the first flexible film 214 and the second conductors 213 formed in the second flexible film 211 are electrically connected to each other. The plurality of the first and second via holes 215 and 212 formed in the first and second flexible films 214 and 211 may be formed substantially parallel to a center line C of folding portions where the flexible display unit 220 and the double-layered flexible FPCB 210 are folded between the substrates 201 as illustrated in FIGS. 2 and 3. While the present exemplary embodiment describes the double-layered FPCB 210 as including two flexible films wherein the first and second flexible films 214 and 211 may be stacked on top of one another, the current embodiment is not limited thereto, and alternative exemplary embodiments include configurations wherein three or more flexible films may be included in the FPCB 210.

Also, the current exemplary embodiment of a flexible display unit 220 includes a device displaying an image using electrophoresis, but the current exemplary embodiment is not limited thereto. The flexible display unit 220 may include various other display devices. For example, exemplary embodiments include configurations wherein the flexible display unit 220 may include an OLED. In such an exemplary embodiment, the flexible display unit 220 may include an organic light emitting layer (not shown) formed between the common electrode 226 formed on a bottom surface of the upper flexible substrate 227 and the plurality of the pixel electrodes 221 formed on a bottom surface of the lower flexible substrate 222.

As described above, according to one or more of the above exemplary embodiments, a plurality of substrates formed of a rigid material are separated from one another by predetermined intervals, and a flexible connection unit and a flexible display unit are formed on the substrates to reduce the radius of curvature of folding portions where the flexible display unit and the flexible connection unit are folded between the substrates. Consequently, a thin foldable display device which has a relatively small thickness when folded may be realized. Also, the substrates may be glass substrates and the driving units may be amorphous silicon TFTs, and thus manufacturing costs may be reduced and the reliability of the foldable display device may be improved.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A foldable display device comprising:
   a plurality of substrates separated from one another by predetermined intervals;
   a plurality of driving units including at least one driving unit disposed on each of the plurality of substrates;
   a flexible display unit disposed above the plurality of substrates and comprising a plurality of pixel electrodes respectively corresponding to the plurality of driving units; and
   a flexible connection unit disposed between the plurality of substrates and the flexible display unit and which electrically connects the plurality of driving units and the plurality of pixel electrodes.

2. The foldable display device of claim 1, wherein the flexible connection unit comprises:
   a flexible layer; and
   a plurality of conductors disposed in the flexible layer and which electrically connects the plurality of driving units and the plurality of pixel electrodes.

3. The foldable display device of claim 2, wherein the flexible layer comprises at least one of plastic and rubber.

4. The foldable display device of claim 2, wherein the flexible layer comprises a plurality of via holes in which the plurality of conductors is disposed.

5. The foldable display device of claim 4, wherein the via holes extend substantially obliquely with respect to a center line of folding portions located between the plurality of substrates.

6. The foldable display device of claim 1, wherein the flexible connection unit comprises a double-layered flexible printed circuit board.

7. The foldable display device of claim 6, wherein the flexible printed circuit board comprises a plurality of flexible films stacked between the plurality of substrates and the flexible display unit and, a plurality of conductors disposed in each of the flexible films and which electrically connects the plurality of driving units and the plurality of pixel electrodes.

8. The foldable display device of claim 7, wherein each of the plurality of flexible films comprise a plurality of via holes in which the plurality of conductors is disposed.

9. The foldable display device of claim 8, wherein the plurality of via holes is disposed substantially parallel to a center line of folding portions located between the plurality of substrates.

10. The foldable display device of claim 7, further comprising a plurality of first pads electrically connecting the plurality of pixel electrodes and the plurality of conductors, wherein the plurality of first pads are disposed on an upper surface of a flexible film disposed under and adjacent to the flexible display unit of the plurality of flexible films.

11. The foldable display device of claim 10, further comprising:
   a plurality of second pads electrically connecting the plurality of pixel electrodes and the plurality of conductors, wherein the plurality of second pads are disposed on a bottom surface of a flexible film disposed above and adjacent to the plurality of substrates of the plurality of flexible films.

12. The foldable display device of claim 1, wherein the plurality of substrates comprise a rigid material.

13. The foldable display device of claim 12, wherein the plurality of substrates comprise glass.

14. The foldable display device of claim 1, wherein the plurality of driving units comprise thin film transistors.

15. The foldable display device of claim 14, wherein the thin film transistors comprise amorphous silicon as a channel material.

16. The foldable display device of claim 1, wherein the flexible display unit is an electrophoretic display.

17. The foldable display device of claim 16, wherein the flexible display unit comprises:
   an upper flexible substrate;
   a lower flexible substrate separated from the upper flexible substrate;
   a common electrode disposed on the upper flexible substrate;
   the plurality of pixel electrodes disposed on the lower flexible substrate; and
   a capsule layer disposed between the upper flexible substrate and the lower flexible substrate.

18. The foldable display device of claim 17, wherein the capsule layer comprises a plurality of microcapsules having a plurality of charged particles contained therein.

19. The foldable display device of claim 1, wherein the flexible display unit comprises:
   an upper flexible substrate;
   a lower flexible substrate separated apart from the upper flexible substrate;
   a common electrode disposed on the upper flexible substrate;
   the plurality of pixel electrodes disposed on the lower flexible substrate; and
   an organic light emitting layer disposed between the upper flexible substrate and the lower flexible substrate.

20. The foldable display device of claim 1, wherein the plurality of substrates are in an unfolded state and the flexible display unit overlaps both the plurality of substrates and the flexible display connection unit.

* * * * *